United States Patent
Shiota

(10) Patent No.: US 10,964,637 B2
(45) Date of Patent: Mar. 30, 2021

(54) PACKAGE AND LIGHT EMITTING DEVICE

(71) Applicant: NICHIA CORPORATION, Anan (JP)

(72) Inventor: Yuki Shiota, Tokushima (JP)

(73) Assignee: NICHIA CORPORATION, Anan (JP)

( * ) Notice: Subject to any disclaimer, the term of this patent is extended or adjusted under 35 U.S.C. 154(b) by 53 days.

(21) Appl. No.: 16/449,446

(22) Filed: Jun. 24, 2019

(65) Prior Publication Data

US 2019/0393144 A1 Dec. 26, 2019

(30) Foreign Application Priority Data

Jun. 25, 2018 (JP) .............................. JP2018-120210

(51) Int. Cl.
*H01L 23/495* (2006.01)
*H01L 23/498* (2006.01)
*H01L 31/0203* (2014.01)
*H01L 33/48* (2010.01)
*H01L 23/00* (2006.01)

(52) U.S. Cl.
CPC .. *H01L 23/49861* (2013.01); *H01L 23/49555* (2013.01); *H01L 24/48* (2013.01); *H01L 24/97* (2013.01); *H01L 31/0203* (2013.01); *H01L 33/486* (2013.01); *H01L 2224/45147* (2013.01); *H01L 2224/48091* (2013.01); *H01L 2224/48247* (2013.01); *H01L 2224/97* (2013.01)

(58) Field of Classification Search
CPC ......... H01L 23/49555; H01L 23/49861; H01L 31/0203; H01L 2224/48091
USPC ................................................. 257/666, 778
See application file for complete search history.

(56) References Cited

U.S. PATENT DOCUMENTS

| | | | |
|---|---|---|---|
| 6,992,385 B2 * | 1/2006 | Satou ...................... | H01L 24/40 257/735 |
| 8,138,598 B2 * | 3/2012 | Shiraishi ............... | H02M 7/003 257/723 |
| 9,165,865 B2 * | 10/2015 | Herbsommer ...... | H01L 21/4825 |
| 10,600,744 B2 * | 3/2020 | Chikamatsu .......... | H01L 21/565 |
| 2010/0164078 A1 * | 7/2010 | Madrid ............. | H01L 23/49562 257/675 |
| 2011/0074000 A1 | 3/2011 | Jaeger et al. | |

(Continued)

FOREIGN PATENT DOCUMENTS

JP  2007-134376  5/2007
JP  2011-517125  5/2011

(Continued)

*Primary Examiner* — Nitin Parekh
(74) *Attorney, Agent, or Firm* — Mori & Ward, LLP

(57) ABSTRACT

A package includes a first lead and a second lead. The first lead includes a first part and a second part connected to the first part. The second lead includes a third part and a fourth part connected to the third part. A molded body having a front surface and rear surface opposite to the front surface. The first part has a first terminal exposed from the rear surface. The first terminal is provided within an outer peripheral edge of the rear surface. The third part has a second terminal exposed from the rear surface. The second terminal is provided within the outer peripheral edge. The first lead or the second lead has a heat releasing terminal exposed from the rear surface. The heat releasing terminal is disposed between the first terminal and the second terminal to be spaced apart from the first terminal and the second terminal.

15 Claims, 9 Drawing Sheets

(56) References Cited

U.S. PATENT DOCUMENTS

| | | | |
|---|---|---|---|
| 2012/0256239 A1* | 10/2012 | Herbsommer | H01L 24/27 |
| | | | 257/288 |
| 2013/0113015 A1 | 5/2013 | Kimura et al. | |
| 2013/0141709 A1 | 6/2013 | Loopstra et al. | |
| 2013/0153952 A1* | 6/2013 | Yamashita | H01L 33/62 |
| | | | 257/99 |
| 2014/0183574 A1 | 7/2014 | Nakabayashi et al. | |
| 2014/0252574 A1* | 9/2014 | Nakabayashi | H01L 23/49503 |
| | | | 257/666 |
| 2014/0252582 A1* | 9/2014 | Nakabayashi | H01L 23/49562 |
| | | | 257/676 |
| 2018/0138134 A1* | 5/2018 | Chikamatsu | H01L 23/49568 |

FOREIGN PATENT DOCUMENTS

| | | |
|---|---|---|
| JP | 2011-108998 | 6/2011 |
| JP | 2013-101996 | 5/2013 |
| JP | 2013-543210 | 11/2013 |
| JP | 2014-029911 | 2/2014 |
| JP | 2014-103365 | 6/2014 |
| JP | 2014-130973 | 7/2014 |
| JP | 2014-146763 | 8/2014 |
| JP | 2015-177151 | 10/2015 |

\* cited by examiner

PACKAGE AND LIGHT EMITTING DEVICE

CROSS-REFERENCE TO RELATED APPLICATIONS

The present application claims priority under 35 U. S. C. § 119 to Japanese Patent Application No. 2018-120210, filed Jun. 25, 2018. The contents of this application are incorporated herein by reference in their entirety.

BACKGROUND OF THE INVENTION

Field of the Invention

The present disclosure relates to a package and a light emitting device.

Discussion of the Background

Various packages used in light emitting devices have been disclosed. For example, Japanese Unexamined Patent Application Publication No. 2014-146763 discloses a lead frame including terminal portions that have different shape patterns and one of which has a half-etched portion formed on a surface thereof. The patent document describes that this lead frame enables equalization of the size of a terminal surface of one terminal portion to be bonded as a lead frame, with the size of a terminal surface of the other terminal portion, to make it possible to set a light semiconductor device at an appropriate position. The above-mentioned technique describes that half-etching is performed on a part of a lead to equalize the size of the terminal surfaces.

SUMMARY OF THE INVENTION

According to one aspect of the present invention, a package includes a first lead, a second lead, and a molded body which holds the first lead and the second lead and has a front surface and rear surface opposite to the front surface. The first lead includes a first part extending in one direction and a second part extending in another direction perpendicular to the one direction to be connected to the first part. The second lead is provided to be spaced apart from the first lead and includes a third part extending in the one direction and a fourth part extending in the another direction to be connected to the third part. The first part of the first lead and the third part of the second lead are disposed in parallel with each other. The second part of the first lead and the fourth part of the second lead are disposed in parallel with each other. The first lead and the second lead have element connection terminals exposed from the front surface of the molded body. The first part has a first terminal exposed from the rear surface of the molded body. The first terminal is provided within an outer peripheral edge of the rear surface. The third part has a second terminal exposed from the rear surface of the molded body. The second terminal is provided within the outer peripheral edge of the rear surface. The first lead or the second lead having a heat releasing terminal exposed from the rear surface of the molded body. The heat releasing terminal is disposed between the first terminal and the second terminal in the rear surface to be spaced apart from the first terminal and the second terminal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
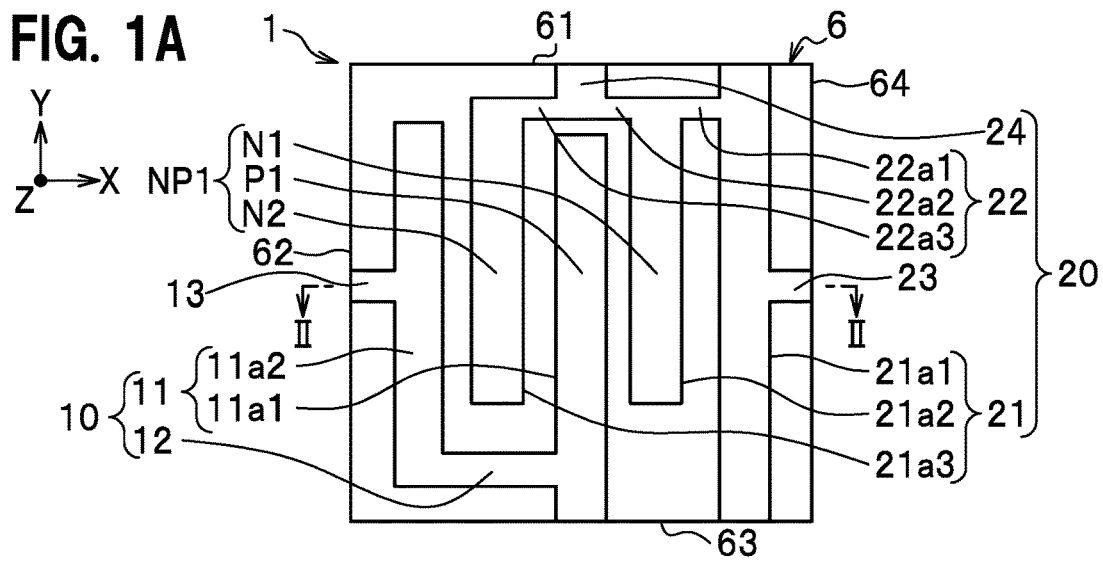
FIG. 1A is a schematic plan view illustrating a package according to a first embodiment.

The embodiments will now be described with reference to the accompanying drawings, wherein like reference numerals designate corresponding or identical elements throughout the various drawings.

Hereinafter, described are packages and light emitting devices according to embodiments. It should be noted, however, that drawings referred to in the following description schematically illustrate the present embodiments, and therefore, the scale of members, the distance between members, the positional relationship of members, and the like are sometimes exaggerated, or a part of a member is not sometimes shown in a drawing. Further, in the following description, the same name and symbol basically indicate the same or the same kind of member, and details of such a member are not sometimes described for convenience. A molded body 6 is formed in a rectangular shape. Thus, the molded body is described with first to fourth sides thereof given the symbols 61 to 64. One exemplary light emitting element 2 connected to a package 1 and a package 1A in a first embodiment and a second embodiment is a light emitting element including, as element electrodes 3, one P-side electrode 3a1 and two N-side electrodes 3a2 and 3a3.

First Embodiment

Figure 1B:
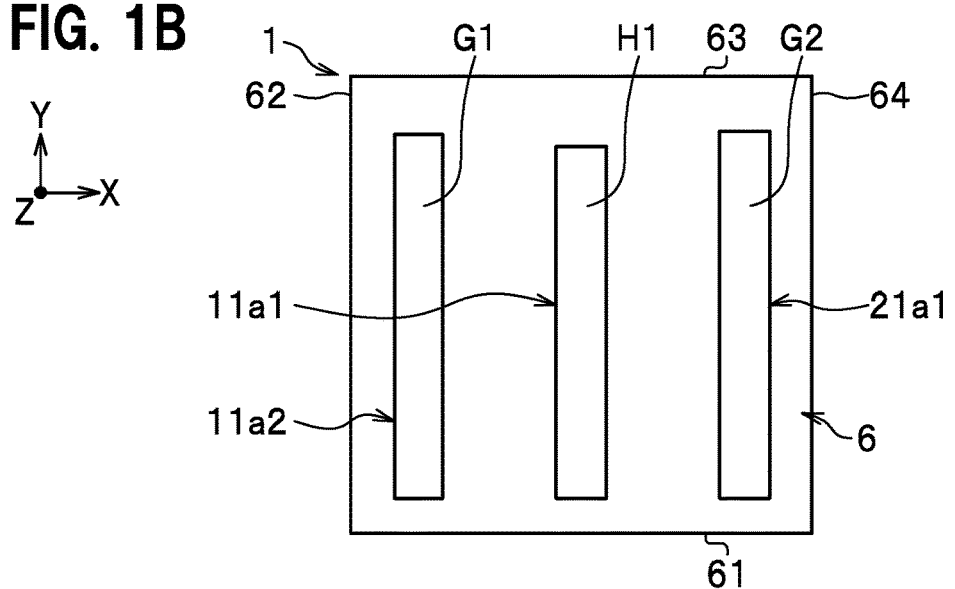
FIG. 1B is a schematic bottom surface view illustrating the package according to the first embodiment.
Figure 1C:
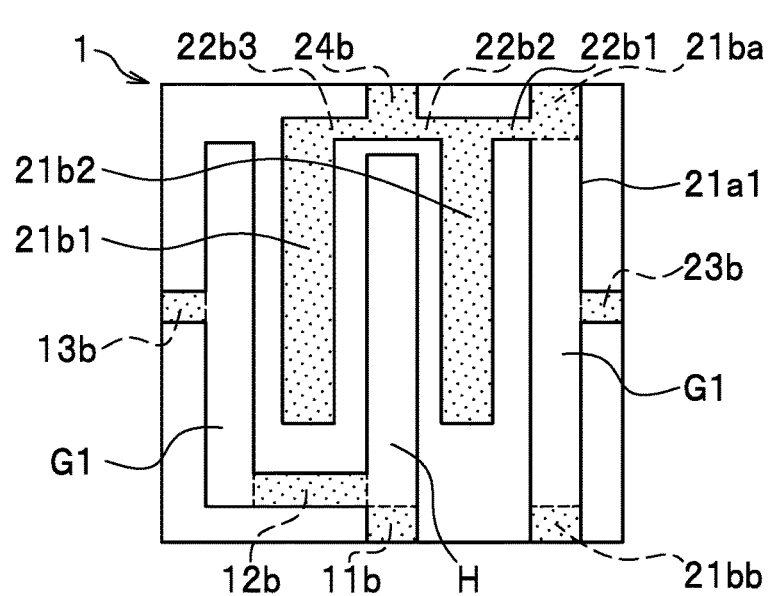
FIG. 1C is a schematic explanatory view illustrating a plane of the package according to the first embodiment and illustrating a configuration of recess portions on a first lead and a second lead by dots.
Figure 2:
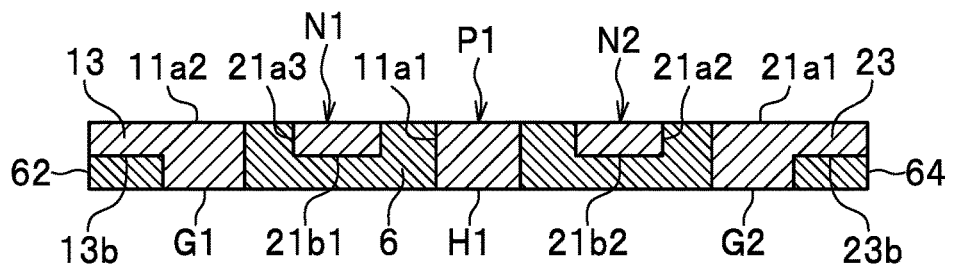
FIG. 2 is a schematic sectional view of the package according to the first embodiment and is a schematic sectional view taken along the line II-II in FIG. 1A.
Figure 3:
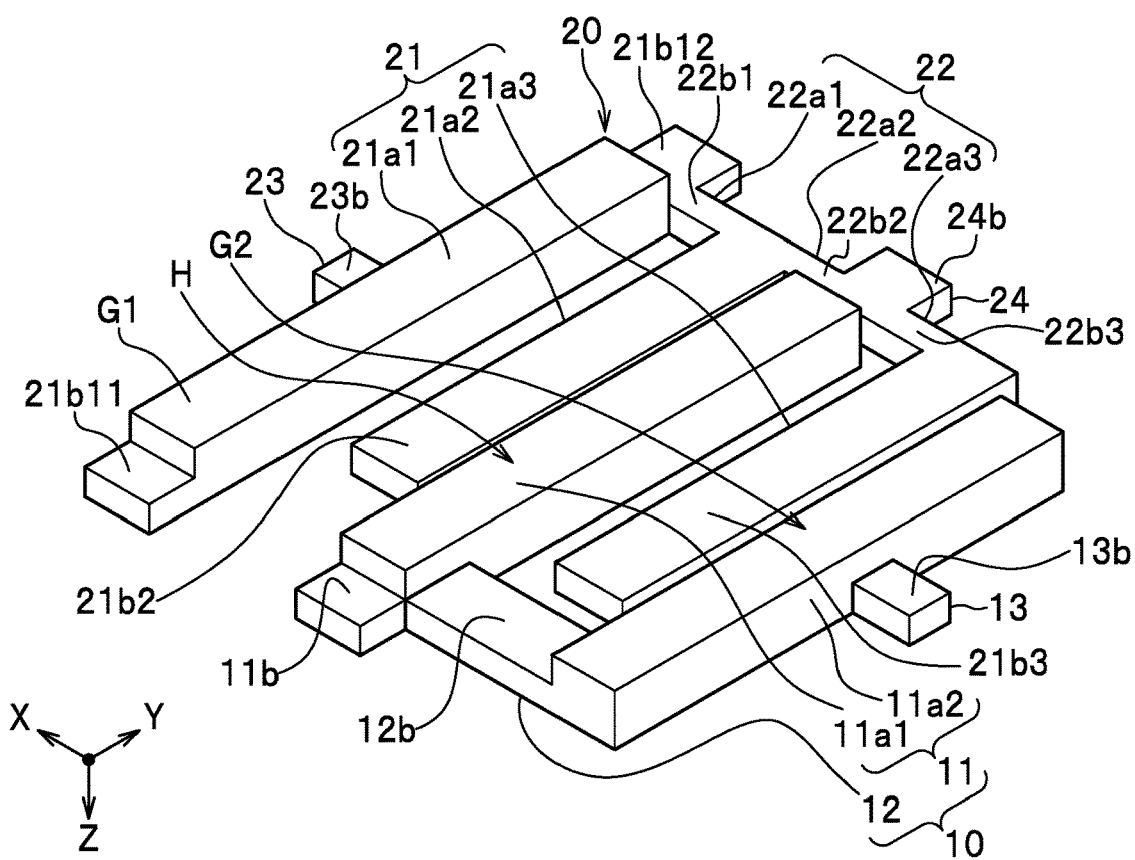
FIG. 3 is a schematic perspective view of rear surfaces of the first lead and the second lead in the package according to the first embodiment.
Figure 4:
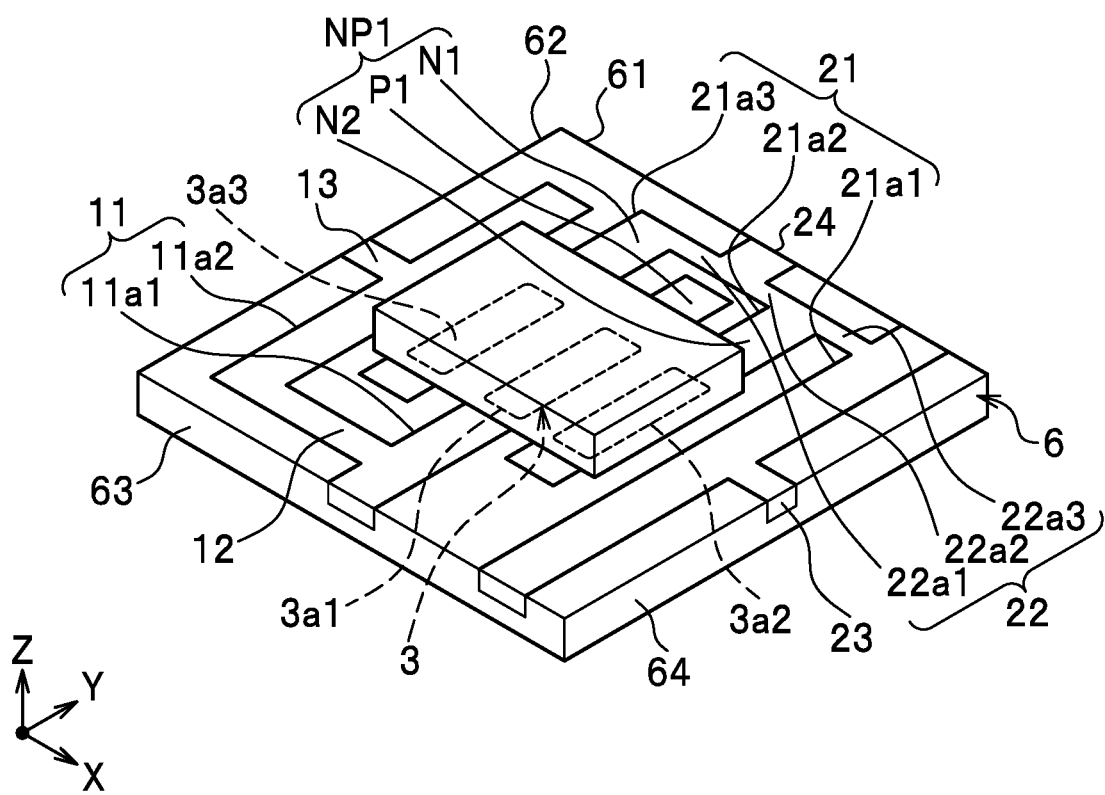
FIG. 4 is a schematic perspective view illustrating a state in which a light emitting element is set on the package according to the first embodiment.

The package 1 according to the first embodiment is described with reference to FIGS. 1A to 4. FIG. 1A is a schematic plan view illustrating the package according to the first embodiment. FIG. 1B is a schematic bottom surface view illustrating the package according to the first embodiment. FIG. 1C is a schematic explanatory view illustrating a plane of the package according to the first embodiment and illustrating a configuration of recess portions on a first lead and a second lead by dots. FIG. 2 is a schematic sectional view of the package according to the first embodiment and is a schematic sectional view taken along the line II-II in FIG. 1A. FIG. 3 is a schematic perspective view of rear surfaces of the first lead and the second lead in the package according to the first embodiment. FIG. 4 is a schematic perspective view illustrating a state in which a light emitting element is set on the package according to the first embodiment.

The package 1 includes a first lead 10, a second lead 20, and the molded body 6 holding the first lead 10 and the second lead 20. The package 1 is, as a whole, formed in a rectangular plate shape having the first side 61, the second side 62, the third side 63, and the fourth side 64. In the package 1, a surface on which the light emitting element 2 is mounted is defined as a front surface and a surface connected to an external electrode is defined as a rear surface. On the front surface of the package 1, element connection terminals NP1 for mounting the light emitting element 2 are formed by at least parts of the first lead 10 and the second lead 20. On the rear surface of the package 1, a first terminal G1 and a second terminal G2 for external electrical connection are provided and a heat releasing terminal H1 for heat release is disposed. The first terminal G1 and the heat releasing terminal H1 are formed by the first lead 10 and the second terminal G2 is formed by the second lead 20. The first lead 10 and the second lead 20 are formed to be spaced apart from each other, with the molded body 6 holding the leads. In the package 1, the first lead 10 and the second lead 20 have surfaces thereof exposed on the front surface of the molded body 6, with at least parts of the exposed portions used as the element connection terminals NP1. In the package 1, the first lead 10 and the second lead 20 have surfaces thereof exposed only at prescribed positions on the rear surface of the molded body 6, with at least parts (here, all) of the exposed portions used as the first terminal G1, the second terminal G2, and the heat releasing terminal H1. The front surfaces and the rear surfaces of the first lead 10 and the second lead 20 are in the same plane with the molded body 6, and the surfaces of the element connection terminals NP1 are in the same plane with the molded body 6 on the front surface of the package 1. The molded body 6 has a thickness smaller than the thickness of the first lead 10 by 3% or less, preferably 1% or less, and further preferably has the same thickness as the first lead 10. The first terminal G1, the heat releasing terminal H1, and the second terminal G2 on the rear surface of the package 1 are in the same plane as the molded body 6.

On the front surface and the rear surface of the molded body 6, the first lead 10 includes portions exposed from the molded body 6 and portions buried in the molded body 6. The first lead 10 includes a first part 11 having a first vertical portion 11a1 and a second vertical portion 11a2 that are formed linearly along the Y direction and in parallel, and a second part 12 that is formed in the X direction perpendicular to the first part 11 and connects the first vertical portion 11a1 to the second vertical portion 11a2. The first vertical portion 11a1 is disposed almost in the center of the package 1 and the second vertical portion 11a2 is disposed near an outer edge of the package 1. The first lead 10 also includes a first extension portion 13 formed from a Y-direction center portion of the first part 11 to the outer edge, or the second side 62 of the molded body 6.

The first part 11 is formed to be spaced apart from a third part 21 and a fourth part 22 of the second lead 20. The first part 11 includes the first vertical portion 11a1 formed in the center of the molded body 6 and the second vertical portion 11a2 formed in parallel with the first vertical portion 11a1 and linearly along one edge, or the second side 62 of the molded body 6 at a position spaced apart from the second side 62.

The first vertical portion 11a1 is formed at a constant width continuously from a position spaced apart from the fourth part 22 of the second lead, which is described later, to a position on the outer edge, or the third side 63 of the molded body 6. On the front surface of the molded body, the first vertical portion 11a1 has a range covering a linear portion thereof defined as a first element connection terminal P1, the linear portion being from one end of the first vertical portion to an inner edge (to a position, on the front surface, before a portion facing a recess portion 11b) in no contact with the third side of the molded body 6. The first element connection terminal P1 is an element connection terminal connected to the P-side electrode 3a that is one of the element electrodes 3 of the light emitting element 2.

On the rear surface of the molded body 6, the first part 11 has the plate thickness thereof reduced by, for example, half-etching in a range from a position connected to the second part 12 to the third side 63 to form the recess portion 11b on the first vertical portion 11a1. On the rear surface of the molded body 6, the recess portion 11b allows entry of a part of the molded body 6 to be buried in the molded body. Therefore, on the rear surface of the molded body 6, the first part 11 is unexposed at the recess portion 11b but is exposed from the molded body 6 at the other portions. On the rear surface of the molded body 6, the first vertical portion 11a1 allows the exposed portion thereof to function as the heat releasing terminal H1. That is, the first vertical portion 11a1 allows at least a part thereof to function as the first element connection terminal P1 on the front surface of the molded body 6, whereas the first vertical portion 11a1 allows at least the portion thereof corresponding to the heat releasing terminal H1 to remain exposed without connecting to an external terminal on the rear surface of the molded body 6.

The first vertical portion 11a1 of the first lead 10 is, before singulation described later, formed integrally and continuously with a cutting portion 24 that is continuous with a fourth part 22 of a next adjacent second lead 20. That is, the first lead 10 and the second lead 20 are formed by repetitively making the same wiring pattern on a continuously formed lead frame, and cutting the cutting portion 24 and a prescribed position of a third vertical portion 21a1 to form a pair of the first lead 10 and the second lead 20. The cutting portion 24 is formed to be exposed on the front surface of the molded body 6 but has the plate thickness thereof reduced to form a recess portion 24b and be buried in the molded body 6 on the rear surface of the molded body 6. The cutting portion 24 (in combination with, for example, the first extension portion 13 or a second extension portion 23) enables formation of an integrated lead frame including the first lead 10 and the second lead 20 that are continuous in multiple pairs.

The second vertical portion 11a2 is formed to be spaced for a prescribed distance apart from and in parallel with the first vertical portion 11a1 and the second side 62 of the molded body 6. The second vertical portion 11a2 is formed such that one end and the other end in the longitudinal direction of the second vertical portion is within the first side 61 and the third side 63 of the molded body 6. The second vertical portion 11a2 has the entire region from the one end to the other end thereof exposed on the front surface of the molded body 6 and has the entire region from the one end to the other end thereof exposed to be used as the first terminal G1 connected to the exterior on the rear surface of the molded body 6.

The second part 12 of the first lead 10 is a part electrically connecting the first vertical portion 11a1 to the second vertical portion 11a2. The second part 12 is formed to be spaced apart from and in parallel with the third side 63 of the molded body 6 and to be perpendicular to the first vertical portion 11a1 and the second vertical portion 11a2. The second part 12 is exposed on the front surface of the molded body 6 and has the plate thickness thereof reduced by, for example, half-etching to form a recess portion 12b and thus be unexposed on the rear surface of the molded body 6.

The first extension portion 13 plays a role of a holding portion for connecting the first lead 10 to the lead frame. The first extension portion 13 is formed perpendicular to the first vertical portion 11a1 from the longitudinal-direction (Y-direction) center of the first vertical portion 11a1 to the outer edge, or the second side 62 of the molded body 6. The first extension portion 13 is provided to be exposed from the molded body 6 on the front surface of the molded body and has the plate thickness thereof reduced for forming a recess portion 13b and being buried in the molded body 6 on the rear surface of the molded body.

The second lead 20 includes portions exposed from the molded body 6 and portions buried in the molded body 6 on the front surface and the rear surface of the molded body 6. The second lead 20 includes the third part 21 in parallel with the first vertical portion 11a1 of the first lead 10 and the fourth part 22 in parallel with the second part 12 of the first lead 10, the third part including the third vertical portion 21a1, a fourth vertical portion 21a2, and a fifth vertical portion 21a3. The fourth part 22 of the second lead 20 is formed in parallel with the second part 12 of the first lead 10. The fourth part 22 is formed in the X direction perpendicular to the third vertical portion 21a1, the fourth vertical portion 21a2, and the fifth vertical portion 21a3 of the third part 21 and includes a first horizontal portion 22a1, a second horizontal portion 22a2, and a third horizontal portion 22a3 that connect the third vertical portion 21a1, the fourth vertical portion 21a2, and the fifth vertical portion 21a3. The second lead 20 also includes the second extension portion 23 that is formed perpendicular to the third vertical portion 21a1 of the third part 21 and extends from the third vertical portion to the fourth side 64.

The third part 21 is disposed to be spaced apart from the first part 11 and the second part 12 of the first lead 10. Here, the third part 21 includes the third vertical portion 21a1, the fourth vertical portion 21a2, and the fifth vertical portion 21a3 and forms, together with the first vertical portion 11a1 and the second vertical portion 11a2 of the first lead 10, five tangent portions that are spaced for a substantially equal distance apart from and in parallel with each other.

The third vertical portion 21a1 of the third part 21 is disposed to be in parallel with and spaced apart from the fourth side 64 of the molded body 6 and is formed at a constant width continuously from the first side 61 over to the third side 63 of the molded body 6. On the front surface of the molded body 6, the third vertical portion 21a1 has a portion from one end to the other end in the longitudinal direction thereof formed to be exposed from the molded body 6. On the rear surface of the molded body 6, the third vertical portion 21a1 has the plate thickness thereof reduced at both ends to form recess portions 21ba and 21bb that are buried in the molded body 6.

That is, on the rear surface of the molded body 6, the third vertical portion 21a1 is buried in the molded body 6 to be unexposed at ranges from a portion in contact with the first side 61 to a prescribed inner edge of the third vertical portion and from a portion in contact with the third side of the molded body 6 to a prescribed inner edge of the third vertical portion, while the third vertical portion is exposed at the other portion. On the rear surface of the molded body 6, the third vertical portion 21a1 is used as the second terminal G2 electrically connected to the exterior. The third vertical portion 21a1 is formed continuously from one end to the other end of the molded body 6 to be in contact with the first side 61 and the third side 63 of the molded body 6. That is, the third vertical portion 21a1 is formed in the lead frame continuously with a next adjacent third vertical portion 21a1 before singulation of first leads 10.

The fourth vertical portion 21a2 is disposed between the first vertical portion 11a1 and the third vertical portion 21a1 to be spaced apart from and in parallel with the first vertical portion and the third vertical portion. The fourth vertical portion 21a2 is formed shorter in the longitudinal direction than the first vertical portion 11a1 and the third vertical portion 21a1 and has one end thereof connected to the fourth part 22. The fourth vertical portion 21a2 has a portion from one end to the other end thereof formed to be exposed on the front surface of the molded body 6 and has the portion from the one end to the other end thereof formed to be buried in the molded body 6 and be unexposed on the rear surface of the molded body 6. The fourth vertical portion 21a2 functions as a second element connection terminal N1 connected to the N-side terminal 3a2 of the light emitting element 2 on the front surface of the molded body 6 and has the plate thickness from the one end to the other end thereof reduced to form a recess portion 21b2, be buried in the molded body 6, and be unexposed on the rear surface of the molded body 6. The fourth vertical portion 21a2 is set such that both ends thereof are positioned to be inwardly spaced apart from the first side 61 and the third side 63 of the molded body 6.

The fifth vertical portion 21a3 is disposed between the first vertical portion 11a1 and the second vertical portion 11a2 to be spaced apart from and in parallel with the first vertical portion and the second vertical portion. The fifth vertical portion 21a3 is formed to have the same length as the fourth vertical portion 21a2. The fifth vertical portion 21a3 has a portion from one end to the other end thereof formed to be exposed on the front surface of the molded body 6 and has the portion from the one end to the other end thereof formed to be buried in the molded body 6 and be unexposed on the rear surface of the molded body 6. On the front surface of the molded body 6, the fifth vertical portion 21a3 is formed to function as a third element connection terminal N2 connected to the N-side terminal 3a3 of the light emitting element 2. On the rear surface of the molded body 6, the fifth vertical portion 21a3 has the plate thickness in the entire region from the one end to the other end thereof reduced to form a recess portion 21b3, be buried in the molded body 6, and be unexposed. The fifth vertical portion 21a3 is set such that both ends in the longitudinal direction thereof are positioned within the first side 61 and the third side 63 of the molded body 6.

The fourth part 22 of the second lead 20 is a part electrically connecting the third vertical portion 21a1, the fourth vertical portion 21a2, and the fifth vertical portion 21a3. Here, the fourth part 22 includes the first horizontal portion 22a1, the second horizontal portion 22a2, and the third horizontal portion 22a3. The first horizontal portion 22a1 connects to the third vertical portion 21a1 and the fourth vertical portion 21a2 and is formed perpendicular to the third vertical portion 21a1 and the fourth vertical portion 21a2. The second horizontal portion 22a2 connects to the cutting portion 24 and the fourth vertical portion 21a2 and is formed perpendicular to the fourth vertical portion 21a2 and the cutting portion 24. The third horizontal portion 22a3 connects to the cutting portion 24 and the fifth vertical portion 21a3 and is formed perpendicular to the cutting portion 24 and the fifth vertical portion 21a3. The first horizontal portion 22a1, the second horizontal portion 22a2, and the third horizontal portion 22a3 are exposed on the front surface of the molded body 6 and have the plate thickness thereof reduced by, for example, half-etching to form recess portions 22b1, 22b2, and 22b3 and thus be unexposed on the rear surface of the molded body 6.

The second extension portion 23 plays a role of a holding portion for connecting the second lead 20 to the lead frame. The second extension portion 23 is formed perpendicular to the third vertical portion 21a1 from the longitudinal-direction (Y-direction) center of the third vertical portion 21a1 to the outer edge, or the fourth side 64 of the molded body 6. The second extension portion 23 is provided to be exposed from the molded body 6 on the front surface of the molded body and have the plate thickness thereof reduced for forming a recess portion 23b and being buried in the molded body 6 on the rear surface of the molded body.

The first lead 10 or the second lead 20 is preferably formed of any of copper, a copper alloy, iron, an iron alloy, aluminum, or an aluminum alloy.

The molded body 6 is a member holding the first lead 10 and the second lead 20. The molded body 6 is formed at the same thickness as the first lead 10 and the second lead 20. The molded body 6 enters into each of the recess portions 11b, 12b, and 13b and the recess portions 21bb, 21ba, 22b1, 22b2, 22b3, 23b, and 24b to bury the surfaces of the leads in the molded body 6. A material for the molded body 6 is, for example, a thermoplastic resin or a thermosetting resin. For the thermoplastic resin, it is possible to use, for example, a polyphthalamide resin, a liquid crystal polymer, polybutylene terephthalate (PBT), or unsaturated polyester. For the thermosetting resin, it is possible to use, for example, an epoxy resin, a modified epoxy resin, a silicone resin, or a modified silicone resin.

On the front surface of the package 1 formed as described above, at least a part of the first vertical portion 11a1 of the first lead 10 and at least parts of the fourth vertical portion 21a2 and the fifth vertical portion 21a3 of the second lead 20 are used as the element connection terminals NP1. As shown in FIG. 4, in setting the light emitting element 2 on the package 1, the P-side electrode 3a1 and the N-side electrodes 3a2 and 3a3 of the light emitting element are connected to the element connection terminals NP1 of the package 1. On the rear surface of the package 1, at least parts of the first vertical portion 11a1 and the second vertical portion 11a2 of the first lead 10 and at least a part of the third vertical portion 21a1 of the second lead 20 are used as the first terminal G1 and the second terminal G2 that are connected to the exterior, and the heat releasing terminal H1.

Accordingly, in the package 1, it is possible to change the positions of the portions set as the element connection terminals on the front surface and of the portions set as the terminals for connection to the exterior or the terminal for heat release on the rear surface. Therefore, it is possible to use the package 1 while changing roles of the first lead 10 and the second lead 20 with use of the prescribed portions of the first lead and the second lead on the front surface and the rear surface of the package.

Second Embodiment

Next, the package 1A according to the second embodiment is described with reference to FIGS. 5A to 8.

Figure 5A:
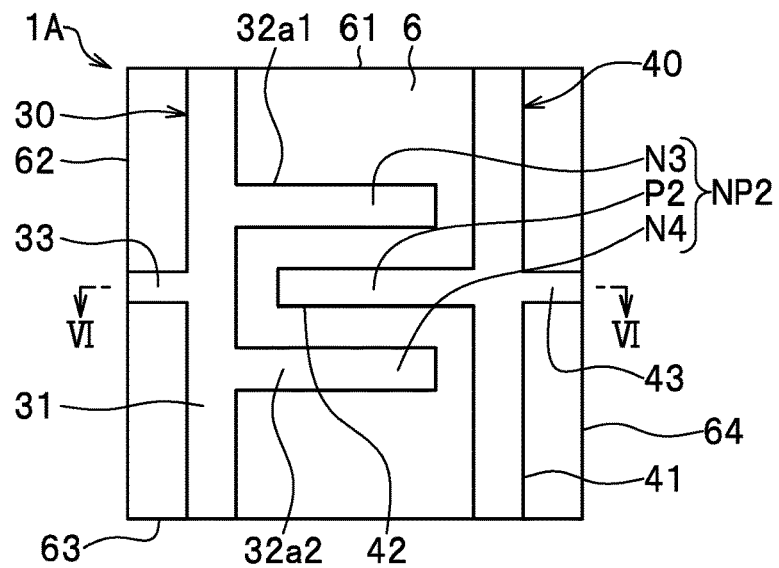
FIG. 5A is a schematic plan view illustrating a package according to a second embodiment.
Figure 5B:
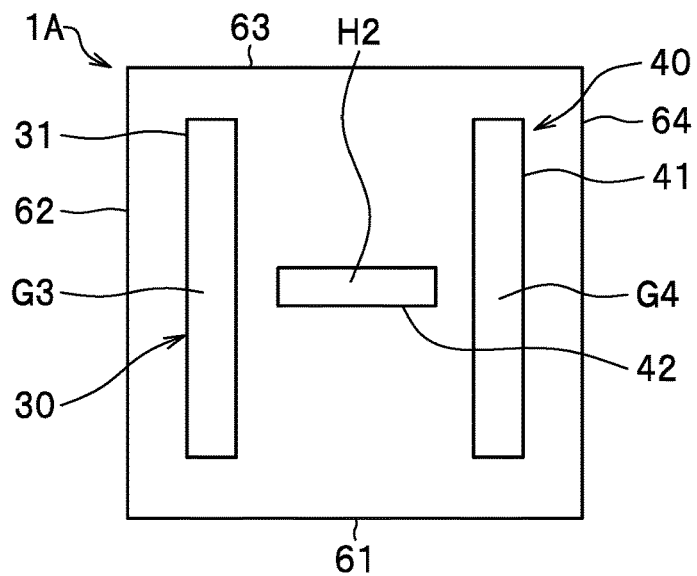
FIG. 5B is a schematic bottom surface view illustrating the package according to the second embodiment.
Figure 5C:
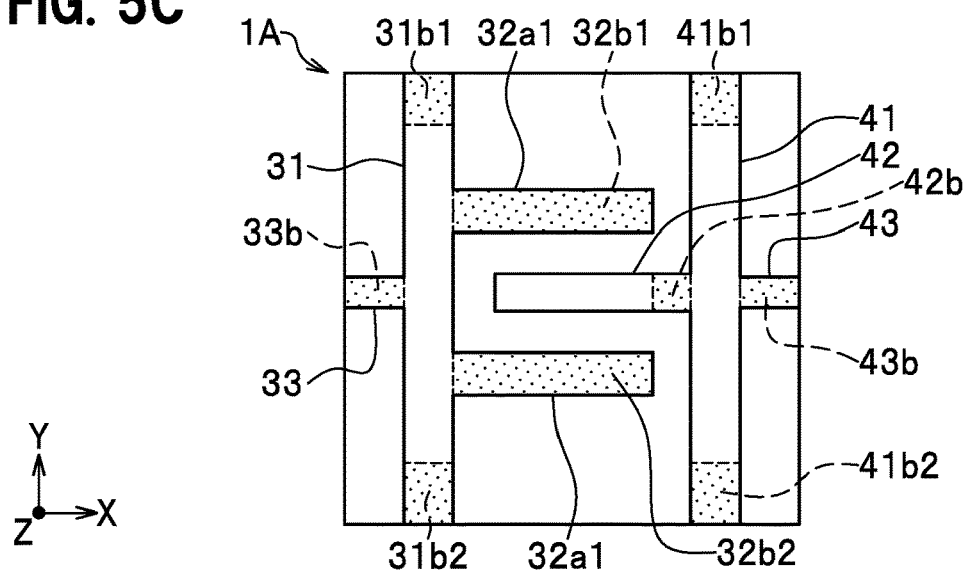
FIG. 5C is a schematic explanatory view illustrating a plane of the package according to the second embodiment and illustrating a configuration of recess portions on a first lead and a second lead by dots.
Figure 6:
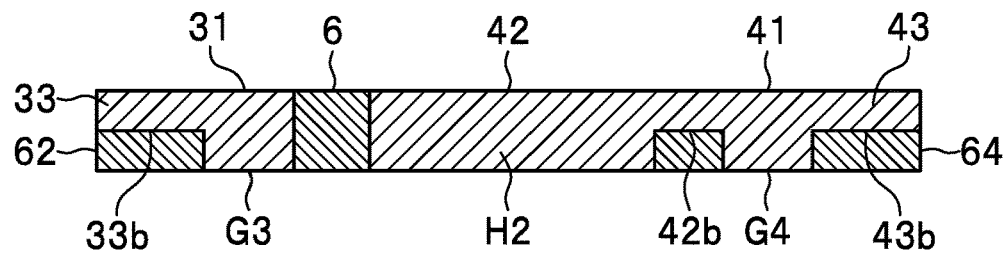
FIG. 6 is a schematic sectional view of the package according to the second embodiment and is a schematic sectional view taken along the line VI-VI in FIG. 5A.
Figure 7:
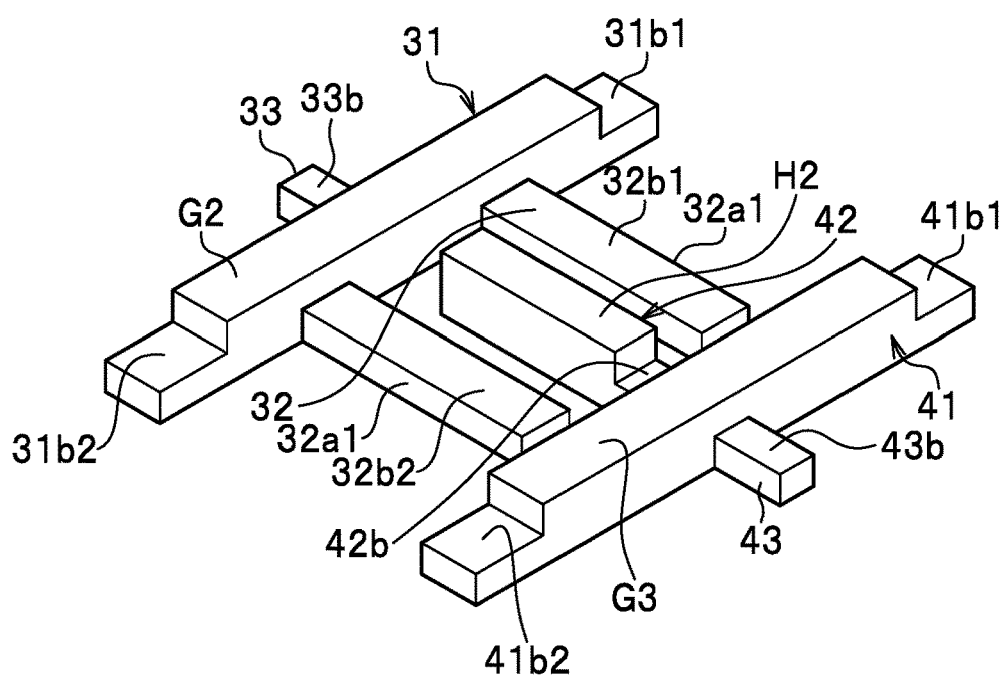
FIG. 7 is a schematic perspective view of rear surfaces of the first lead and the second lead in the package according to the second embodiment.
Figure 8:
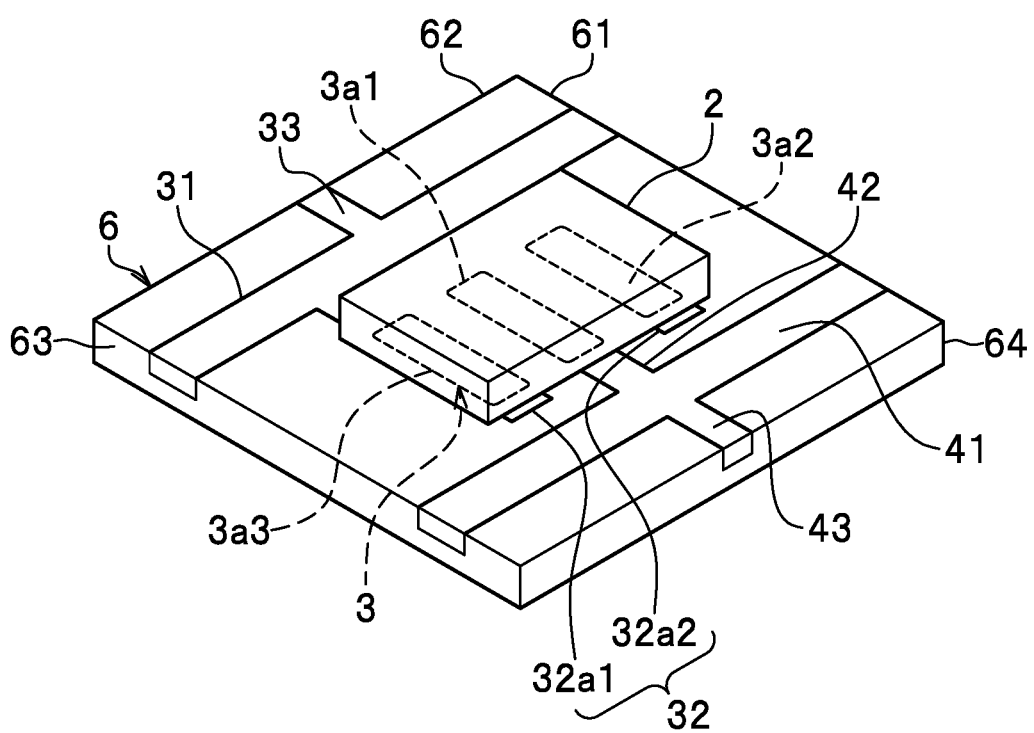
FIG. 8 is a schematic perspective view illustrating a state in which the light emitting element is set on the package according to the second embodiment.

FIG. 5A is a schematic plan view illustrating the package according to the second embodiment. FIG. 5B is a schematic bottom surface view illustrating the package according to the second embodiment. FIG. 5C is a schematic explanatory view illustrating a plane of the package according to the second embodiment and illustrating a configuration of recess portions on a first lead and a second lead by dots. FIG. 6 is a schematic sectional view of the package according to the second embodiment and is a schematic sectional view taken along the line VI-VI in FIG. 5A. FIG. 7 is a schematic perspective view of rear surfaces of the first lead and the second lead in the package according to the second embodiment. FIG. 8 is a schematic perspective view illustrating a state in which the light emitting element is set on the package according to the second embodiment. The second embodiment is different from the first embodiment in wiring shapes of the first lead and the second lead, and the same member that has been already described is given the same symbol and is not described here for convenience.

The package 1A includes a first lead 30, a second lead 40, and the molded body 6 holding the first lead 30 and the second lead 40. The package 1A is, as a whole, formed in a rectangular plate shape having the first side 61, the second side 62, the third side 63, and the fourth side 64. On the front surface of the package 1A, element connection terminals NP2 for mounting the light emitting element 2 are formed by at least parts of the first lead 30 and the second lead 40. On the rear surface of the package 1A, a first terminal G3 is formed by the first lead 30 to perform external electrical connection, and a second terminal G4 and a heat releasing terminal H2 are formed by the second lead 40. In the package 1A, the first lead 30 and the second lead 40 are formed to be spaced apart from each other, with the molded body 6 holding the leads. In the package 1A, the first lead 30 and the second lead 40 have surfaces thereof exposed on the front surface of the molded body 6, with the exposed portions used as the element connection terminals NP2. In the package 1A, the first lead 30 and the second lead 40 have surfaces thereof exposed at only prescribed positions on the rear surface of the molded body 6, with the exposed portions used as the first terminal G3 and the second terminal G4 that are connected to the exterior, and the heat releasing terminal H2 for heat release.

On the front surface and the rear surface of the molded body 6, the first lead 30 includes portions exposed from the molded body 6 and portions buried in the molded body 6. The first lead 30 includes a first part 31 formed linearly along the Y direction, and a second part 32 that is formed in the X direction perpendicular to the first part 31 and has a first horizontal portion 32a1 and a second horizontal portion 32a2. The first lead 30 also includes a first extension portion 33 formed from a Y-direction center portion of the first part 31 to the outer edge, or the second side 62 of the molded body 6.

The first part 31 of the first lead 30 is formed to be spaced apart from a third part 41 and a fourth part 42 of the second lead 40. The first part 31 is formed along the second side 62 of the molded body 6, with a prescribed distance away from the second side, in parallel with the second side 62 and the third part 41 of the second lead, which is described later, at a constant width. On the front surface of the molded body, the first part 31 is formed to be exposed in a range from one end to the other end thereof, with the one end set at a position in contact with the first side 61 of the molded body 6 and the other end set at a position in contact with the third side 63 of the molded body 6. On the rear surface of the molded body, the first part 31 has the plate thickness thereof reduced at the one end and the other end to form recess portions 31b1 and 31b2. On the rear surface of the molded body, the first part 31 has a portion thereof exposed from the molded body 6 except the recess portions 31b1 and 31b2, to be used as the first terminal G3 connected to the exterior.

On the rear surface of the molded body 6, the recess portions 31b1 and 31b2 allow entry of a part of the molded body 6 to be buried in the molded body. Therefore, on the rear surface of the molded body 6, the first part 31 is unexposed at the recess portions 31b1 and 31b2 but is exposed from the molded body 6 at the other portion. On the rear surface of the molded body 6, the first part 31 allows the exposed portion thereof to function as the first terminal G3. The first part 31 is exposed from the molded body 6 on the front surface of the molded body 6 and allows the portion thereof exposed from the molded body 6 to function as the first terminal G3 on the rear surface of the molded body 6. The first part 31 of the first lead 30 is, before singulation as described later, formed at a constant width continuously from the first side 61 to the third side 63 of the molded body 6 to be continuous with a first part 31 of a next adjacent first lead 30.

The second part 32 of the first lead 30 is formed perpendicular to the first part 31. The second part 32 includes the first horizontal portion 32a1 and the second horizontal portion 32a2 that are formed to be spaced for a prescribed distance apart from and in parallel with each other. On the front surface of the molded body 6, the first horizontal portion 32a1 and the second horizontal portion 32a2 of the second part 32 each have the entire surface region from one end to the other end thereof exposed. On the rear surface of the molded body 6, the second part 32 has recess portions 32b1 and 32b2 formed thereon to bury the entire surface region from the one end to the other end of the second part in the molded body 6. On the front surface of the molded body 6, the first horizontal portion 32a1 and the second horizontal portion 32a2 of the second part 32 allow parts of the exposed portions thereof to become a second element connection terminal N3 and a third element connection terminal N4. On the rear surface of the molded body 6, the second part is unexposed and buried in the molded body 6. The second element connection terminals N3 and N4 are element connection terminals connected to the N-side electrodes 3a2 and 3a3 that are two of the element electrodes 3 of the light emitting element 2.

The first extension portion 33 plays a role of a holding portion for connecting the first lead 30 to the lead frame. The first extension portion 33 is formed perpendicular to the first part 31 from the longitudinal-direction (Y-direction) center of the first part 31 to the outer edge, or the second side 62 of the molded body 6. The first extension portion 33 is provided to have the entire surface thereof exposed from the molded body 6 on the front surface of the molded body and have the plate thickness thereof reduced for forming a recess portion 33b and being buried in the molded body 6 on the rear surface of the molded body.

The second lead 40 includes portions exposed from the molded body 6 and portions buried in the molded body 6 on the front surface and the rear surface of the molded body 6. The second lead 40 includes the third part 41 in parallel with the first part 31 of the first lead 30 and the fourth part 42 in parallel with the second part of the first lead 30. The second lead 40 further includes a second extension portion 43 that is formed perpendicular to the longitudinal-direction center of the third part 41 and extends from the center to the fourth side 64.

The third part 41 is formed to be spaced apart from the first part 31 and the second part 32 of the first lead 30. The third part 41 is formed along the fourth side 64 of the molded body 6, being spaced for a prescribed distance apart from the fourth side, in parallel with the fourth side 64 and the first part 31 of the first lead, at a constant width. On the front surface of the molded body, the third part 41 is formed to be exposed from the molded body 6 in a range covering its entire surface region from a position in contact with the first side 61 of the molded body 6 to a position in contact with the third side 63 of the molded body 6. On the rear surface of the molded body, the third part 41 has the plate thickness thereof reduced at one end and the other end to form recess portions 41b1 and 41b2. On the rear surface of the molded body, the third part 41 has a surface portion thereof exposed from the molded body 6 except the recess portions 41b1 and 41b2, to be used as the second terminal G4 connected to the exterior.

On the rear surface of the molded body 6, the recess portions 41b1 and 41b2 allow entry of a part of the molded body 6 to be buried in the molded body. Therefore, on the rear surface of the molded body 6, the third part 41 is unexposed at the recess portions 41b1 and 41b2 and is exposed from the molded body 6 at the other surface portion. The third part 41 is exposed from the molded body 6 on the front surface of the molded body 6 and allows the portion thereof exposed from the molded body 6 to function as the second terminal G4 connected to the exterior on the rear surface of the molded body 6. The third part 41 of the second lead 40 is, before singulation as described later, formed at a constant width continuously from the first side 61 to the third side 63 of the molded body 6 to be continuous with a third part 41 of a next adjacent second lead 40.

The fourth part 42 of the second lead 40 is formed in the longitudinal-direction center of the third part 41 to be perpendicular to the third part 41. The fourth part 42 is disposed between the first horizontal portion 32a1 and the second horizontal portion 32a2 of the second part 32 to be spaced apart from and in parallel with the first horizontal portion and the second horizontal portion. The fourth part 42, and the first horizontal portion 32a1 and the second horizontal portion 32a2 of the second part 32 form three connection portions in parallel. On the front surface of the molded body 6, the fourth part 42 has the entire surface region thereof exposed from the molded body 6 and allows at least a part of the exposed portion thereof to be used as a first element connection terminal P2. The first element connection terminal P2 is a terminal connected to the P-side electrode 3a1 of the light emitting element 2. On the rear surface of the molded body 6, the fourth part 42 has the plate thickness thereof reduced by, for example, half-etching at a base end connected to the third part 41 to form a recess portion 42b. On the rear surface of the molded body 6, the fourth part 42 has the recess portion 42b thereof buried in the molded body 6, has a surface portion thereof exposed from the molded body 6 except the recess portion 42b, and allows the exposed portion thereof to be used as the heat releasing terminal H2.

The second extension portion 43 plays a role of a holding portion for connecting the second lead 40 to the lead frame. The second extension portion 43 is formed perpendicular to the third part 41 from the longitudinal-direction (Y-direction) center of the third part 41 to the outer edge, or the fourth side 64 of the molded body 6. The second extension portion 43 is provided to have the entire surface thereof exposed from the molded body 6 on the front surface of the molded body and have the plate thickness thereof reduced for forming a recess portion 43b and being buried in the molded body 6 on the rear surface of the molded body.

On the front surface of the package 1A formed as described above, at least parts of the first horizontal portion 31a1 and the second horizontal portion 31a2 of the first lead 30 and at least a part of the fourth part 42 of the second lead 40 are used as the element connection terminals NP2. As shown in FIG. 8, in setting the light emitting element 2 on the package 1A, the P-side electrode 3a1 and the N-side electrodes 3a2 and 3a3 of the light emitting element are connected to the element connection terminals NP2 of the package 1A. On the rear surface of the package 1A, at least a part of the first part 31 of the first lead 30 and at least a part of the third part of the second lead 40 are used as the first terminal G3 and the second terminal G4 that are connected to the exterior, and at least a part of the fourth part of the second lead is used as the heat releasing terminal H2. Accordingly, in the package 1A, it is possible to change the positions of the portions set as the element connection terminals on the front surface and of the portions set as the terminals for connection to the exterior or the terminal for heat release on the rear surface. Therefore, it is possible to use the package 1A while changing roles of the first lead 30 and the second lead 40 with use of the prescribed portions of the first lead and the second lead on the front surface and the rear surface of the package. In the package 1A, the first part 31 and the second part 32 of the first lead 30 and the third part 41 and the fourth part 42 of the second lead 40 are all formed at the same width but may be formed at different widths for convenience.

Light Emitting Device

Figure 9A:
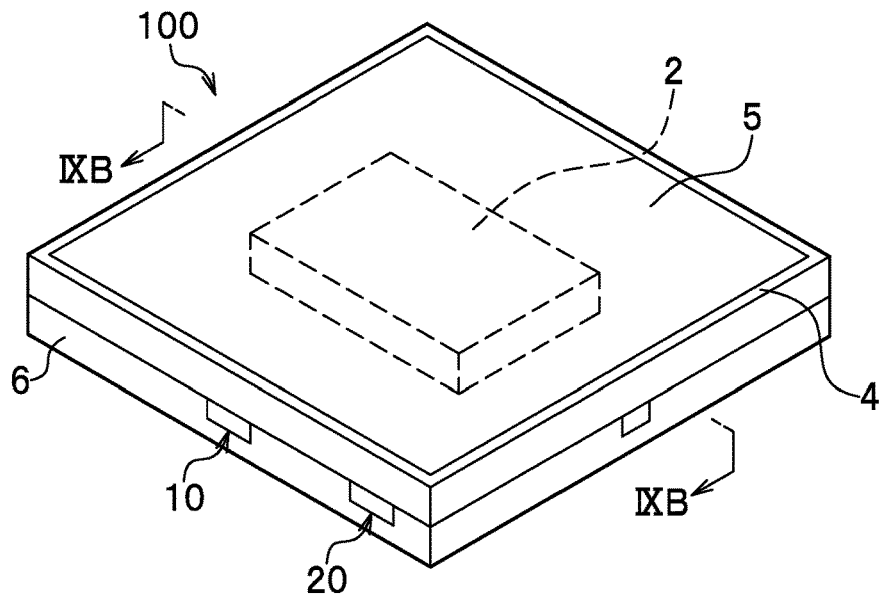
FIG. 9A is a schematic perspective view illustrating a configuration of a light emitting device including the package according to the first embodiment.
Figure 9B:
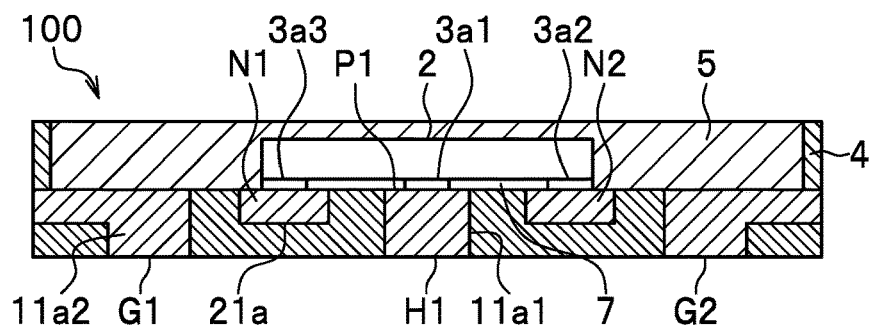
FIG. 9B is a schematic sectional view taken along the line IXB-IXB in FIG. 9A with respect to the configuration of the light emitting device including the package according to the first embodiment.

Next, a light emitting device 100 is described with reference to FIGS. 9A and 9B. FIG. 9A is a schematic perspective view illustrating a configuration of a light emitting device including the package according to the first embodiment. FIG. 9B is a schematic sectional view taken along the line IXB-IXB in FIG. 9A with respect to the configuration of the light emitting device including the package according to the first embodiment. The light emitting device 100 that includes the package 1 is described as a representative example.

The light emitting device 100 includes the package 1, the light emitting element 2, the element electrodes 3, a frame body 4, a covering member 5, and underfill 7. The light emitting device 100 that includes the package 1 is capable of improving the bonding strength between the leads. The package 1 described in the first embodiment is used.

Light Emitting Element

The light emitting element 2 includes, as the element electrodes 3, the two N-side electrodes 3a2 and 3a3 and the one P-side electrode 3a1 formed between the two N-side electrodes 3a2 and 3a3. The light emitting element 2 is flip-chip mounted on the element connection terminals NP1 of the package 1.

The light emitting element 2 has the two N-side electrodes 3a2 and 3a3 thereof connected to the second element connection terminal N1 and the third element connection terminal N2, respectively, the second element connection terminal and the third element connection terminal being at least parts of the fourth vertical portion 21a2 and the fifth vertical portion 21a3 of the second lead 20. The light emitting element 2 has the one P-side electrode 3a1 thereof connected to the first element connection terminal P1 that is at least a part of the first vertical portion Ha1 of the first lead 10. This allows the light emitting element 2 to be mounted on the first lead 10 and the second lead 20 in the package 1. The light emitting element 2 used here is not particularly limited in terms of its shape, size, or the like. As a light emission color of the light emitting element 2, it is possible to select any wavelength according to the use application of the light emitting device. For example, as a blue (light with a wavelength of 430 to 490 nm) light emitting element 2, it is possible to use a light emitting element that includes a light emitting layer containing a GaN material or an InGaN material. As the InGaN material, it is possible to use, for example, $In_XAl_YGa_{1-X-Y}N$ ($0 \leq X \leq 1$, $0 \leq Y \leq 1$, and $X+Y \leq 1$).

Underfill

The underfill 7 is formed in a gap between the package 1 and the light emitting element 2. The underfill 7 is a member that absorbs stress caused by the difference in coefficient of thermal expansion between the light emitting element 2 and the package 1 and increases the heat releasing property. A material for the underfill 7 is, for example, a thermosetting resin such as a silicone resin or an epoxy resin. Using, as the material for the underfill 7, a light reflective member such as a white resin is capable of reflecting light emitted from the light emitting element 2 toward the package 1 to increase the flux of light.

Frame Body

The frame body 4 is formed on the package 1 to surround the light emitting element 2. The frame body 4 is a member constituting a wall portion of the light emitting device 100. It is possible to form the frame body 4 by, for example, a thermoplastic resin, a thermosetting resin, a modified resin of these resins, or a hybrid resin containing at least one of these resins. Examples of the thermoplastic resin include a polyamide resin, a polyphthalamide resin, a polycarbonate resin, a polyphenylene sulfide resin, an ABS resin, an acrylic resin, a polybutylene terephthalate resin, a polyethylene terephthalate resin, a polycyclohexane terephthalate resin, and a liquid crystal polymer. Examples of the thermosetting resin include an epoxy resin, a silicone resin, a urea resin, a phenolic resin, a BT resin, a polyimide resin, and a polyurethane resin. These base materials may contain a material known in this field, such as a reflecting member, a coloring agent, a filler, reinforcement fiber, or a fluorescent substance described later. Particularly, as the reflecting member, a material excellent in reflectivity is preferable, and a white material such as titanium oxide or zinc oxide is preferable. Examples of the filler include silica and alumina. Examples of the reinforcement fiber include glass, calcium silicate, and potassium titanate. For example, the frame body 4 that contains the reflecting member allows light from the light emitting element 2 to be efficiently extracted upward, mainly in the Z direction or the like.

Covering Member

The covering member 5 is a member covering the light emitting element 2.

The covering member 5 is provided in the frame body 4 on the package 1 to cover the light emitting element 2. The covering member 5 is a member covering the light emitting element 2. The covering member 5 is provided to protect the light emitting element 2 from, for example, external force, dust, and moisture and to improve the heat resistance, the weather resistance, and the light stability of the light emitting element 2. A material for the covering member 5 is a light-transmissive member, i.e., a thermosetting resin, for example, a transparent material such as a silicone resin, an epoxy resin, or a urea resin. It is possible to add to these materials a fluorescent material or a filler such as a high-light-reflectivity substance, for making the covering member have a prescribed function.

The covering member 5 having, for example, a fluorescent material mixed therein is capable of facilitating the color adjustment of the light emitting device 100. As the fluorescent material, it is possible to use a material that has a specific gravity larger than the specific gravity of the covering member 5, absorbs light from the light emitting element 2, and converts the wavelength of the light. The fluorescent material having a specific gravity larger than the specific gravity of the covering member 5 preferably settles on a package 1 side of the covering member. Specific examples of the fluorescent material include yellow fluorescent materials such as YAG ($Y_3Al_5O_{12}$:Ce) and silicate, red fluorescent materials such as CASN ($CaAlSiN_3$:Eu) and KSF ($K_2SiF_6$:Mn), and green fluorescent materials such as chlorosilicate and $BaSiO_4$:$Eu^{2+}$.

As the filler added to the covering member 5, it is possible to suitably use, for example, a high-light-reflectivity substance such as $SiO_2$, $TiO_2$, $Al_2O_3$, $ZrO_2$, or MgO. It is also possible to use, for example, an organic or inorganic coloring dye or coloring pigment for the purpose of cutting a wavelength other than a desired wavelength.

The light emitting device 100 configured as described above allows the light emitting element 2 to emit light by externally supplied power and irradiate the exterior with light through the covering member 5. The light emitting element 2 generates heat by continuous light emitting operation. The heat releasing terminal H1 of the package 1, however, is capable of exteriorly releasing the heat and reducing unstable operation caused by the heat. In the light emitting device 100, it is possible to change the terminal pattern on the front surface of the package 1 and the terminal pattern on the rear surface of the package 1. Therefore, the light emitting device 100 is capable of employing an appropriate configuration in accordance with the use place or environment.

Figure 9C:
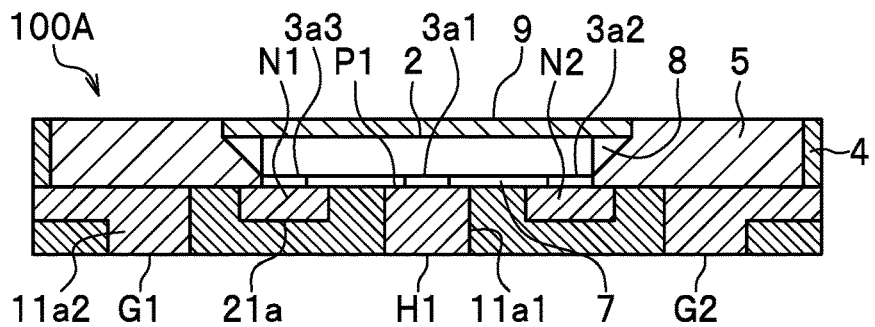
FIG. 9C is a schematic sectional view illustrating another configuration of the light emitting device including the package according to the first embodiment.

As another embodiment, the light emitting device may be configured as illustrated in FIG. 9C. FIG. 9C is a schematic sectional view illustrating another configuration of the light emitting device including the package according to the first embodiment.

A light emitting device 100A includes a light-transmissive member 9 disposed on an upper surface of the light emitting element 2, with an adhesive material 8 interposed between the light-transmissive member and the upper surface. In the light emitting device 100A, the light-transmissive member 9 has an area larger than the area of the upper surface of the light emitting element 2. In the light emitting device 100A, a periphery of the light-transmissive member 9 and a side surface of the light emitting element 2 are covered with the adhesive material 8 to form a fillet, which guides light from the light emitting element 2 to allow extraction of the light from the light-transmissive member 9. Here, the shape of the light-transmissive member 9 is illustrated as a plate shape. The light-transmissive member, however, may be configured to form a protrusion shape. The light-transmissive member 9 may be any of a glass material, a resin, or the like as long as the material or the resin is, as its transmissivity, capable of transmitting at least 60% or more of light from the light emitting element 2.

Figure 10A:
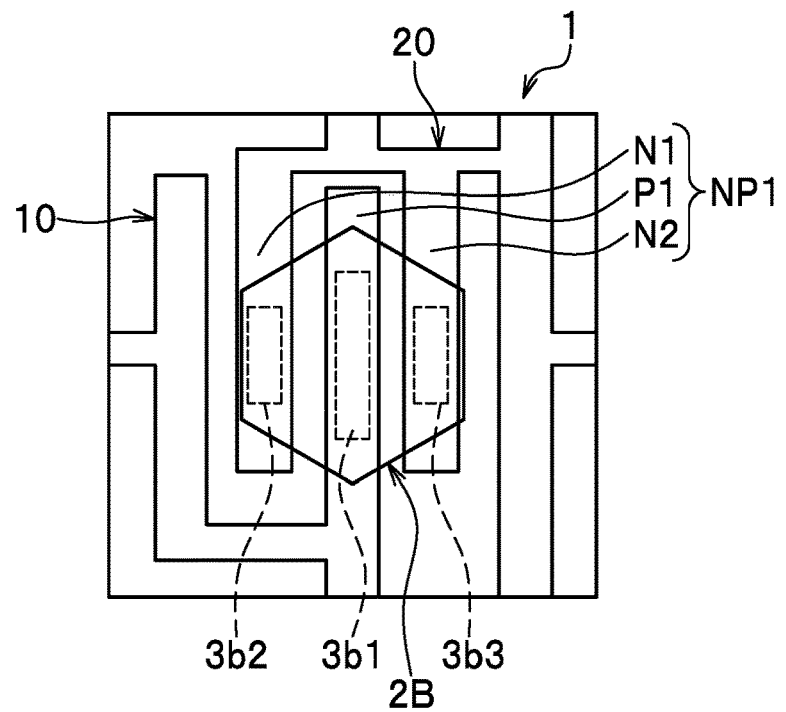
FIG. 10A is a schematic plan view illustrating a light emitting device including the package according to the first embodiment and a light emitting element with another configuration.
Figure 10B:
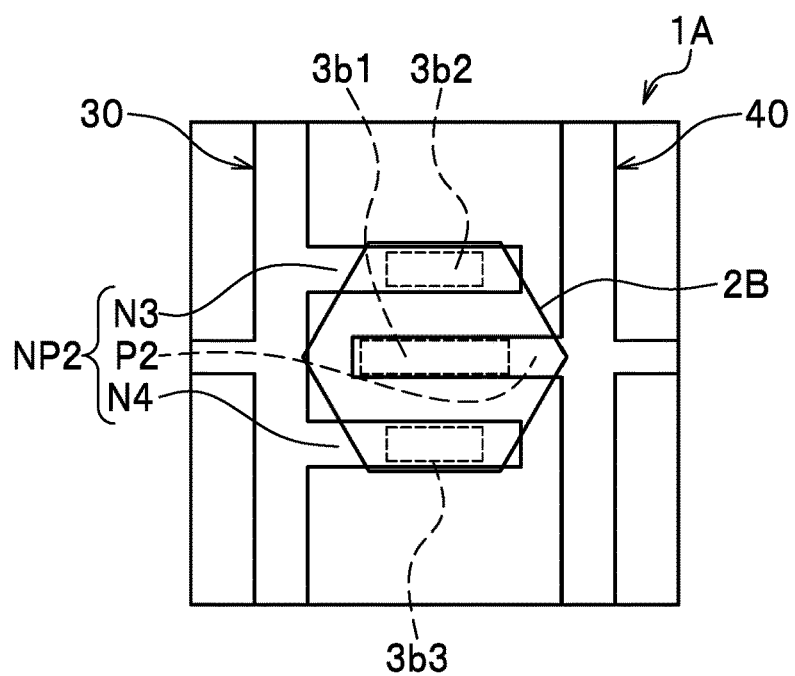
FIG. 10B is a schematic plan view illustrating a light emitting device including the package according to the second embodiment and a light emitting element with another configuration.

As another embodiment, the light emitting device may be configured as illustrated in FIG. 10A or 10B. FIG. 10A is a schematic plan view illustrating a light emitting device that includes the package according to the first embodiment and a light emitting element with another configuration. FIG. 10B is a schematic plan view illustrating a light emitting device that includes the package according to the second embodiment and a light emitting element with another configuration.

The light emitting element 2 included in the light emitting device 100 has been described as having a rectangular shape. As illustrated in FIGS. 10A and 10B, however, for example, a light emitting element 2B having a hexagonal appearance shape may be used. Use of a hexagonal appearance-shaped light emitting element as the light emitting element 2B facilitates acquisition of a large area for a P-side electrode 3b1 in the center of the package to bring the area of the P-side electrode close to the total area of two N-side electrodes 3b2 and 3b3 and thus facilitates handling of a large current.

Figure 11A:
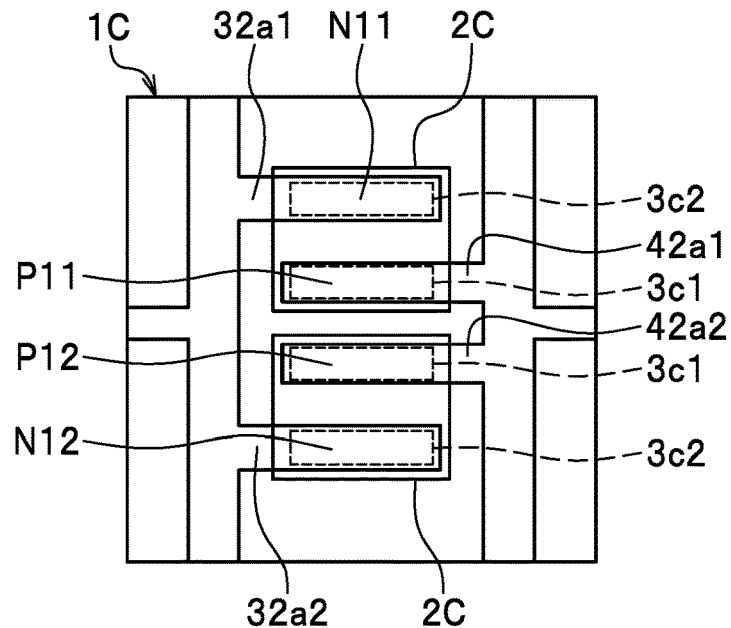
FIG. 11A is a schematic plan view illustrating a state in which two light emitting elements with another configuration are set on a package according to another embodiment.
Figure 11B:
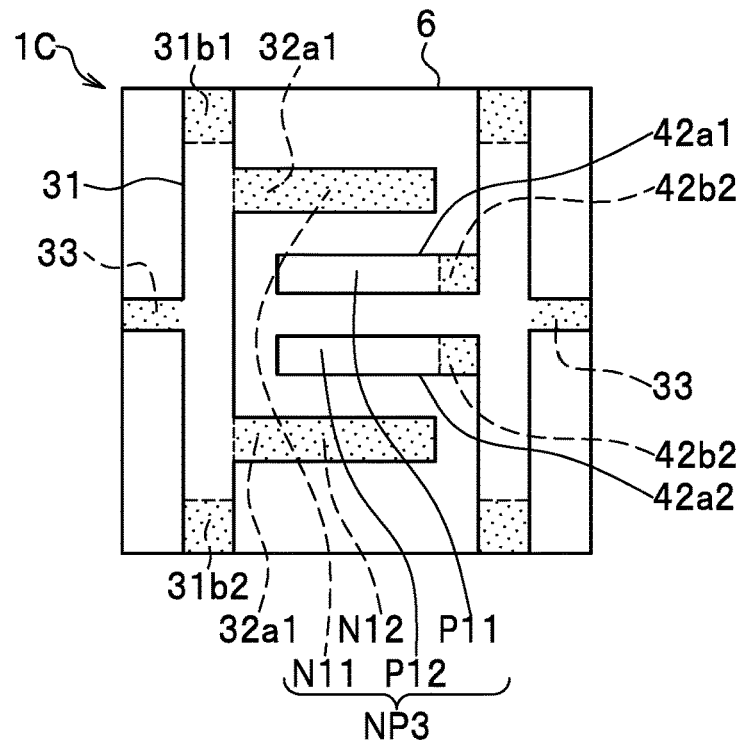
FIG. 11B is a schematic explanatory view illustrating a plane of the package used in FIG. 11A and illustrating a configuration of recess portions on a first lead and a second lead by dots.

Further, as another embodiment, the light emitting device may be configured as illustrated in FIGS. 11A and 11B. FIG. 11A is a schematic plan view illustrating a state in which two light emitting elements with another configuration are set on a package according to another embodiment. FIG. 11B is a schematic explanatory view illustrating a plane of the package used in FIG. 11A and illustrating a configuration of recess portions on a first lead and a second lead by dots.

The light emitting device 100 that includes one light emitting element 2 has been described. The light emitting device, however, may be used with two light emitting elements 2C mounted therein. In this case, used as the package is, for example, one formed by configuring the package 1A to form two horizontal portions as the fourth part. The other configurations of the package are regarded as being the same as indicated in the second embodiment and are not described here.

That is, in a package 1C, the fourth part 42 is formed to include a first horizontal portion 42a1 and a second horizontal portion 42a2. The first horizontal portion 42a1 and the second horizontal portion 42a2 of the second lead 40 are disposed between the first horizontal portion 32a1 and the second horizontal portion 32a2 of the first lead 30 to be spaced apart from and in parallel with each other. In the package 1C, at least parts of the first horizontal portion 42a1 and the second horizontal portion 42a2 of the second lead 40 and the first horizontal portion 32a1 and the second horizontal portion 32a2 of the first lead 31 are connected to the two light emitting elements 2C.

Therefore, it is possible to dispose side by side the two light emitting elements 2C each having an N-side electrode 3c2 and a P-side electrode 3c1 on the package 1C.

In disposing the light emitting elements 2C, the N-side electrode 3c2 of one light emitting element 2C is connected to a second element connection terminal N11 that is at least a part of the first horizontal portion 32a1 of the first lead 30, and the P-side electrode 3c1 of the light emitting element 2C is connected to a second element connection terminal P11 that is at least a part of the first horizontal portion 42a1 of the second lead 40. Then, the N-side electrode 3c2 of the other light emitting element 2C is connected to a second element connection terminal N12 that is at least a part of the second horizontal portion 32a2 of the first lead 30, and the P-side electrode 3c1 of the light emitting element 2C is connected to a first element connection terminal P12 that is at least a part of the second horizontal portion 42a2 of the second lead 40. Thus, the two light emitting elements 2C are disposed on the package 1C.

On the rear surface of the package 1C, used as heat releasing terminals are exposed portions on the first horizontal portion 42a1 and the second horizontal portion 42a2 of the fourth part 42 in the second lead 40, the exposed portion having neither recess portion 42b1 nor 42b2 formed thereon. In the package 1C, it is possible to use, as the first terminal and the second terminal that are connected to the exterior, at least parts of exposed portions on the first part 31 of the first lead 30 and on the third part 41 of the second lead 40.

Thus, even when the light emitting element 2C is increased in number, it is possible to use the package 1C while changing roles of the first lead 30 and the second lead 40 with use of the prescribed portions of the first lead and the second lead on the front surface and the rear surface of the package.

As described above, with the configurations of the packages 1, 1A, and 1C indicated in the embodiments as examples of the present disclosure, it is possible to provide a package and a light emitting device that are suitable for flip-chip mounting of a light emitting element. Further, it is possible to form terminals on the rear surface of the package, with the direction of the terminals changed by 90 degrees from the direction of terminals formed on the front surface of the package and to change the positions of terminals between the front surface and the rear surface of the package.

Method of Manufacturing Light Emitting Device

Next, a method of manufacturing the light emitting device 100 according to the first embodiment is described with appropriate reference to FIGS. 1A to 4, 9A, and 9B. Each drawing shows one light emitting device and/or one first lead and one second lead. Before singulation, however, light emitting devices, first leads, and second leads are continuously formed vertically and horizontally.

The method of manufacturing the light emitting device according to the present embodiment includes a lead frame forming step, a package manufacturing step, a light emitting element mounting step; a frame body forming step; a covering member forming step; and a singulation step.

In the method of manufacturing the light emitting device according to the present embodiment, the lead frame used from the lead frame forming step to the covering member forming step is in a state of including a plurality of first leads and a plurality of second leads that are formed continuously, and after light emitting devices 100 corresponding to packages 1 are manufactured, the light emitting devices 100 are singulated in the singulation step. The light emitting device 100, however, may be manufactured using only one or a singulated package 1. The first extension portion 13, the second extension portion 23, the cutting portion 24, and the like are formed continuously with an adjacent light emitting device, so that a plurality of sets of portions are formed to be arranged in one lead frame.

The lead frame forming step is forming a lead frame that includes a plurality of first leads and second leads on which the molded bodies 6, the light emitting elements 2, and the like have not been disposed. The lead frame that has the plurality of first leads and second leads formed thereon is formed by subjecting a metal plate to punching or etching. On the lead frame is disposed a mask at positions corresponding to the first leads and the second leads except the portions corresponding to the recess portions, and the lead frame is half-etched. The lead frame has the plate thickness thereof reduced by half-etching to form the recess portions on the first leads and the second leads.

The package manufacturing step is manufacturing a plurality of packages by providing molded bodies on the lead frame formed. In the package manufacturing step, it is possible to form the molded bodies by sandwiching the lead frame with upper and lower molds and injecting a resin into a space sandwiched between the upper and lower molds. In the lead frame, the resin is disposed in a recess, or a portion having a small thickness, whereas the resin is disposed only on a side surface and not on upper and lower surfaces of a portion having a large thickness. Here, the plurality of packages are formed as resin packages. The lead frame held by the molded bodies is preferably subjected to burr removal operation for removing burr on the surface of the lead frame.

The light emitting element mounting step is mounting light emitting elements at prescribed positions on the first leads and the second leads. In the light emitting element mounting step, the light emitting elements 2 are bond to the prescribed positions of the first leads and the second leads by picking up a light emitting element with, for example, a collet, disposing the light emitting element on the element connection terminals NP1 of the first lead and the second lead, and subjecting the package having the light emitting element disposed thereon to a heat treatment with, for example a reflow furnace. Then, underfill such as a silicone resin is provided on a lower surface of the light emitting element mounted on the package, between the light emitting element and the package.

The frame body forming step is forming frame bodies around the light emitting elements. In the frame body forming step, a frame body higher than the light emitting element 2 is provided to surround the light emitting element and give a rectangular shape in a planar view. In the frame body forming step, the frame bodies are provided by performing, for example, line coating, using a dispenser or the like, with, for example, a thermosetting composition in a lattice shape along boundaries set in advance around the light emitting elements. Alternatively, in the frame body forming step, a guide may be disposed on the package to give a frame body having a prescribed shape and height when a resin to be the frame body is provided, and the disposed guide may be removed when the resin is cured. It is also possible to form the frame body by transfer molding, injection molding, compression molding, or potting.

The covering member forming step is providing a covering member to cover the light emitting element within a region where the frame body is provided. In the covering member forming step, the covering member is formed in the frame body by supplying, with a dispenser, for example, a light-transmissive thermosetting composition within the frame body and thereafter curing the thermosetting composition. The covering member is provided to cover an upper surface and a side surface of the light emitting element 2 and an upper surface of the package. As the covering member, a thermosetting composition containing a fluorescent material may be supplied.

The singulation step is singulating the light emitting devices 100 formed in conjunction with each other. The singulation is performed by, for example, dicing, laser dicing, or breaking. It is possible to singulate the light emitting devices 100 by cutting with, for example, a cutter along a boundary between adjacent packages. In other words, the light emitting devices are singulated by cutting a package together with the lead frame along between adjacent frame bodies. As described above, it is possible to manufacture the light emitting device 100 by performing the steps.

The method of manufacturing the light emitting device 100 according to the first embodiment has been heretofore described. The method, however, is not limited to this example but may include another step before or after each of the steps described.

In the first embodiment, on the rear surface of the package, the first part of the first lead 10 is used as the heat releasing terminal. The first vertical portion of the first lead, however, may be used as the heat releasing terminal by disposing the first vertical portion outward and positioning the third part of the second lead 20 in the center of the package. Further, in the second embodiment, the element connection terminals are set as three portions in total, specifically, two portions, i.e., the first horizontal portion 32*a*1 and the second horizontal portion 32*a*2 of the first lead 30, and one portion, i.e., the fourth part 42 of the second lead 40. The element connection terminals, however, may be set as one portion of the first lead 30 and two portions of the second lead 40. Then, the one portion of the first lead 30 may be used as the heat releasing terminal.

In the embodiments, the first leads 10 and 30 and the second leads 20 and 40 have been described as examples of forming recess portions by half-etching. The recess portions, however, may be forming by machinery cutting or bending or curving the leads along the plate thickness of the leads.

Obviously, numerous modifications and variations of the present invention are possible in light of the above teachings. It is therefore to be understood that within the scope of the appended claims, the invention may be practiced otherwise than as specifically described herein.

What is claimed is:

1. A package comprising:
a first lead including a first part extending in one direction and a second part extending in another direction perpendicular to the one direction to be connected to the first part;
a second lead provided to be spaced apart from the first lead and including a third part extending in the one direction and a fourth part extending in the another direction to be connected to the third part;
the first part of the first lead and the third part of the second lead being disposed in parallel with each other, and the second part of the first lead and the fourth part of the second lead being disposed in parallel with each other;
a molded body holding the first lead and the second lead and having a front surface and rear surface opposite to the front surface;
the first lead and the second lead having respective element connection terminals exposed from the front surface of the molded body;
the first part having a first terminal exposed from the rear surface of the molded body, the first terminal being provided within an outer peripheral edge of the rear surface;
the third part having a second terminal exposed from the rear surface of the molded body, the second terminal being provided within the outer peripheral edge of the rear surface; and
the first lead or the second lead having a heat releasing terminal exposed from the rear surface of the molded body, the heat releasing terminal being disposed between the first terminal and the second terminal in the rear surface to be spaced apart from the first terminal and the second terminal.

2. The package according to claim 1, wherein the heat releasing terminal is at least a part of the first part or the third part in parallel with the first terminal and the second terminal.

3. The package according to claim 1, wherein the heat releasing terminal is at least a part of the second part or the fourth part perpendicular to the first terminal and the second terminal.

4. The package according to claim 1, wherein
on the front surface of the molded body, the first part and the third part include a total of 5 portions disposed in parallel and alternately and 3 portions in a center of the 5 portions of the first part and the third part are set as the element connection terminals, and
on the rear surface of the molded body, at least parts of linear portions at both ends of the 5 portions of the first part and the third part are set as the first terminal and the second terminal and at least a part of a linear portion in the center of the 5 portions of the first part and the third part is set as the heat releasing terminal.

5. The package according to claim 1, wherein
on the front surface of the molded body, 3 portions of the second part and the fourth part are set as the element connection terminals, the 3 portions being aligned alternately in a direction perpendicular to the first part or the third part in parallel, and
on the rear surface of the molded body, at least parts of linear portions of the first part and the third part are set as the first terminal and the second terminal and at least a part of a linear portion in a center of the 3 portions of the second part and the fourth part is set as the heat releasing terminal.

6. The package according to claim 1, wherein on the rear surface of the molded body, the first lead and the second lead each have a recess portion along plate thickness of the first lead and the second lead and portions having no recess portion are exposed from the molded body to form the first terminal, the second terminal, and the heat releasing terminal.

7. The package according to claim 1, wherein at least parts of any portions of the first part to the fourth part except the element connection terminals on the front surface of the molded body each have a recess portion on the rear surface of the molded body and portions having no recess portion are exposed from the molded body to form the first terminal, the second terminal, and the heat releasing terminal on the rear surface of the molded body.

8. The package according to claim 1, wherein the first terminal, the second terminal, and the element connection terminals each include a plating thereon.

9. The package according to claim 8, wherein the plating includes gold, silver, copper, platinum, nickel, palladium, or an alloy containing one of these metals.

10. The package according to claim 1, wherein the first lead and the second lead are formed of any of copper, a copper alloy, or an iron alloy.

11. The package according to claim 1, wherein
on the front surface of the molded body, the first lead includes a first extension portion extending perpendicularly to the first part and continuously to the outer peripheral edge of the molded body, and
on the front surface of the molded body, the second lead includes a second extension portion extending perpendicularly to the third part and continuously to the outer peripheral edge of the molded body.

12. The package according to claim 6, wherein the recess portion is formed by reducing the plate thickness of the first lead and the second lead or having a bent or curved shape of the first lead and the second lead along the plate thickness of the first lead and the second lead.

13. A light emitting device comprising:
the package according to claim 1; and
a light emitting element flip-chip mounted on the package.

14. The light emitting device according to claim 13, comprising a frame body formed on the package to surround the light emitting element, and a covering member formed in the frame body to cover the light emitting element.

15. The light emitting device according to claim 13, wherein the light emitting element has a polygonal shape in a planar view.

* * * * *